United States Patent
Romankiw

(10) Patent No.: US 6,596,624 B1
(45) Date of Patent: Jul. 22, 2003

(54) PROCESS FOR MAKING LOW DIELECTRIC CONSTANT HOLLOW CHIP STRUCTURES BY REMOVING SACRIFICIAL DIELECTRIC MATERIAL AFTER THE CHIP IS JOINED TO A CHIP CARRIER

(75) Inventor: Lubomyr Taras Romankiw, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 09/619,745

(22) Filed: Jul. 19, 2000

Related U.S. Application Data
(60) Provisional application No. 60/146,772, filed on Jul. 31, 1999.

(51) Int. Cl.[7] .......................................... H01L 21/4763
(52) U.S. Cl. ........................ 438/619; 438/623; 438/633
(58) Field of Search ................................. 438/619, 622, 438/623, 631, 633, 113

(56) References Cited

U.S. PATENT DOCUMENTS

| | | | |
|---|---|---|---|
| 4,899,439 A | | 2/1990 | Potter et al. ................... 29/846 |
| 4,920,639 A | * | 5/1990 | Yee .............................. 29/846 |
| 5,126,192 A | | 6/1992 | Chellis et al. ............... 428/323 |
| 5,171,713 A | * | 12/1992 | Matthews .................... 437/189 |
| 5,256,274 A | | 10/1993 | Poris ........................... 205/123 |
| 5,386,142 A | | 1/1995 | Kurtz et al. ................. 257/690 |
| 5,567,982 A | | 10/1996 | Bartelink .................... 257/664 |
| 5,798,559 A | | 8/1998 | Bothra et al. ................ 257/522 |
| 5,828,121 A | | 10/1998 | Lur et al. .................... 257/522 |
| 6,016,000 A | * | 1/2000 | Moslehi ....................... 257/522 |
| 6,033,996 A | | 3/2000 | Rath et al. ................... 438/756 |
| 6,091,149 A | * | 7/2000 | Hause et al. ................. 257/758 |
| 6,184,121 B1 | * | 2/2001 | Buchwalter et al. ......... 438/622 |
| 6,204,165 B1 | * | 3/2001 | Ghoshal ....................... 438/619 |
| 6,255,712 B1 | | 7/2001 | Clevenger et al. ........... 257/522 |

FOREIGN PATENT DOCUMENTS

GB  2330001 A  4/1999  .......... H01L/21/768

OTHER PUBLICATIONS

M.B. Anand et al., "Use of Gas as Low–k Interlayer Dielectric in LSI's: Demonstration of Feasibility," IEEE Transactions on Electron Devices, vol. 44, No. 11, Nov. 1997, pp. 1965–1971.*

Batchelder, Tom et al, In–line cure of SOD low–k films, Mar. 1999 Solid State Technology, pp 31,32,34.

(List continued on next page.)

*Primary Examiner*—Carl Whitehead, Jr.
*Assistant Examiner*—Stephen V. Smoot
(74) *Attorney, Agent, or Firm*—Judith D. Olsen; Robert Trepp

(57) ABSTRACT

Disclosed is a multilayer integrated circuit structure joined to a chip carrier, and a process of making, in which the area normally occupied by a solid dielectric material in the IC is at least partially hollow. The hollow area can be filled with a gas, such as air, or placed under vacuum, minimizing the dielectric constant. Several embodiments and processing variants are disclosed. In one embodiment of the invention, the wiring layers, which are embedded in a temporary dielectric, alternate with via layers, also embedded in a temporary dielectric, in which the vias, besides establishing electrical communication between the wiring layers, also provide mechanical support for after the temporary dielectric is removed. Additional support is optionally provided by support structures though the interior levels and at the periphery of the chip. The temporary dielectric is removed subsequent to joining by dissolution or by ashing in an oxygen-containing plasma.

24 Claims, 6 Drawing Sheets

OTHER PUBLICATIONS

Krongelb, S. et al, Electrochemical process for advanced package fabrication, 09/98 IBM J. Res. Develop. vol. 42 No. 5 pp575–585.

Singer, Peter, The New Low–k Candidate: It's a Gas, 03/99 Semiconductor International (editorial).

Lin, X.W. et al, Future interconnect technologies and copper metallization Oct. 1998 Solid State Technology pp 63, 64, 68, 72, 74, 76, 79.

Shieh, Ben et al, Air gaps lower k of interconnect dielectrics 02/99 Solid State Technology pp 51, 52, 54, 57, 58.

Kohl, Paul A. et al, Air–Gaps for Electrical Interconnections 1998 Electrochemical and Solid–State Letters 1(1) pp 49–51.

Ryan, J.G. et al. The evolution of interconnection technology at IBM, Jul. 1995, IBM J. Res. Develop. vol. 39 No. 4, cover and pp. 371–381.

* cited by examiner

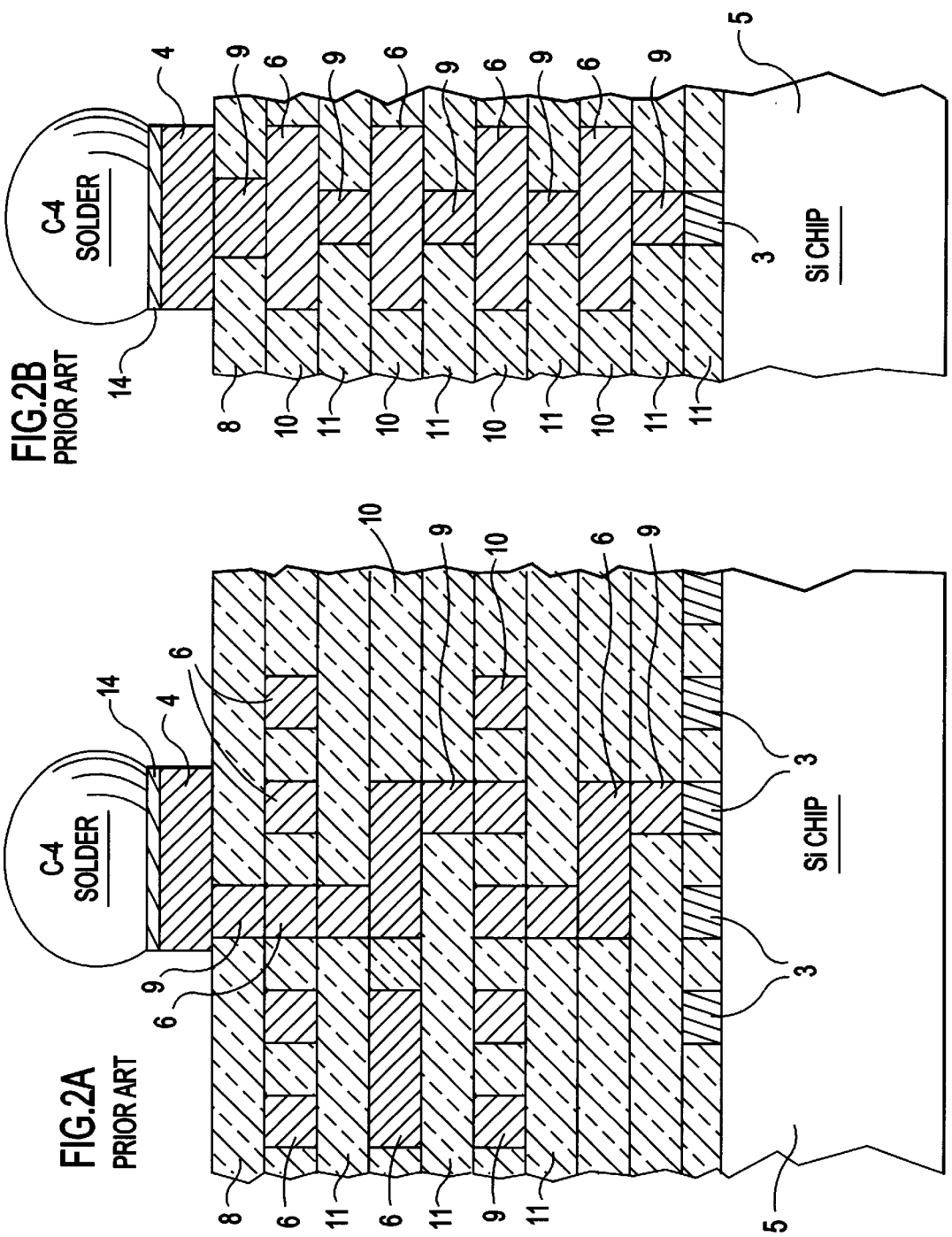

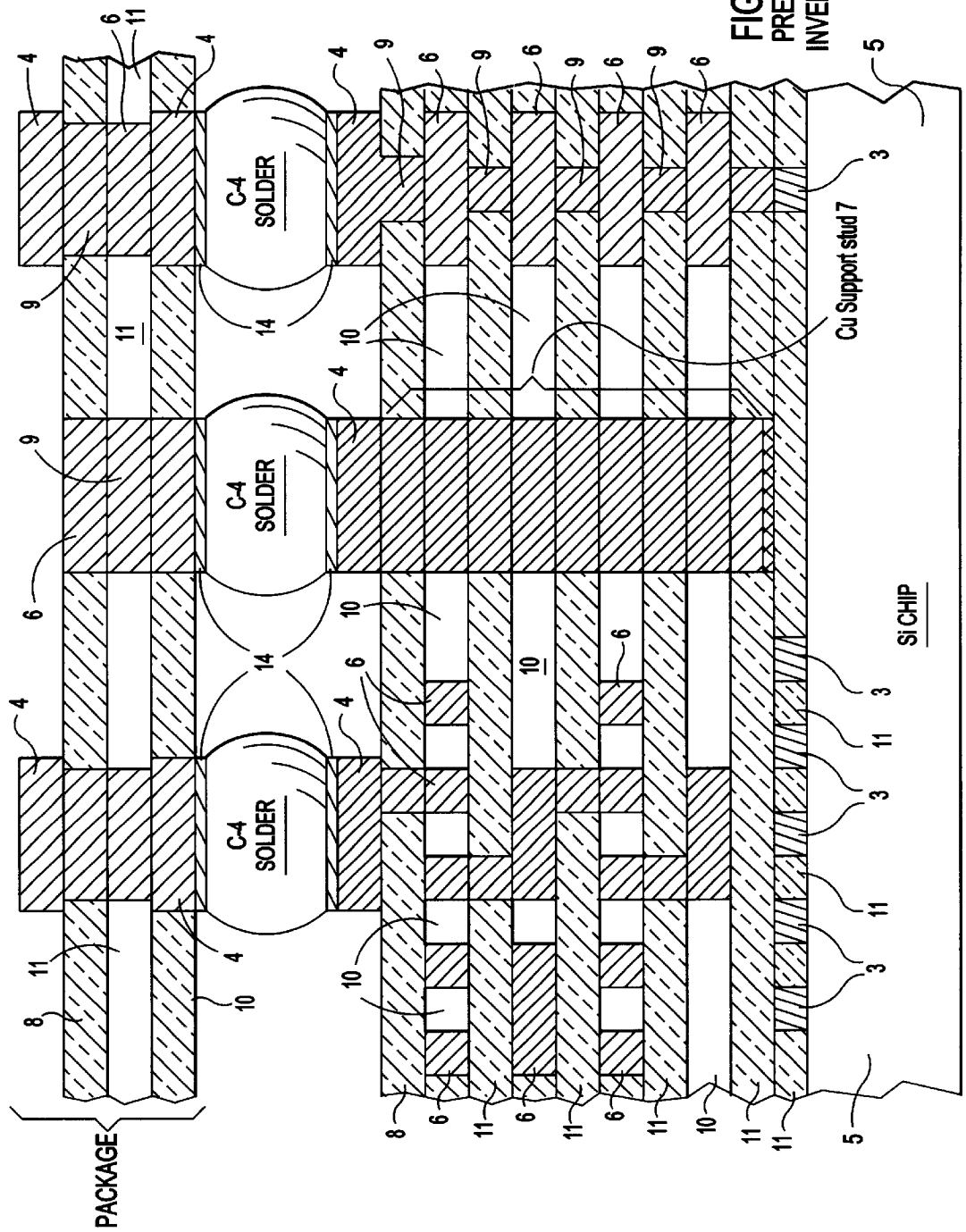
FIG. 2C PRESENT INVENTION

PRESENT INVENTION

FIG. 4
PRIOR ART
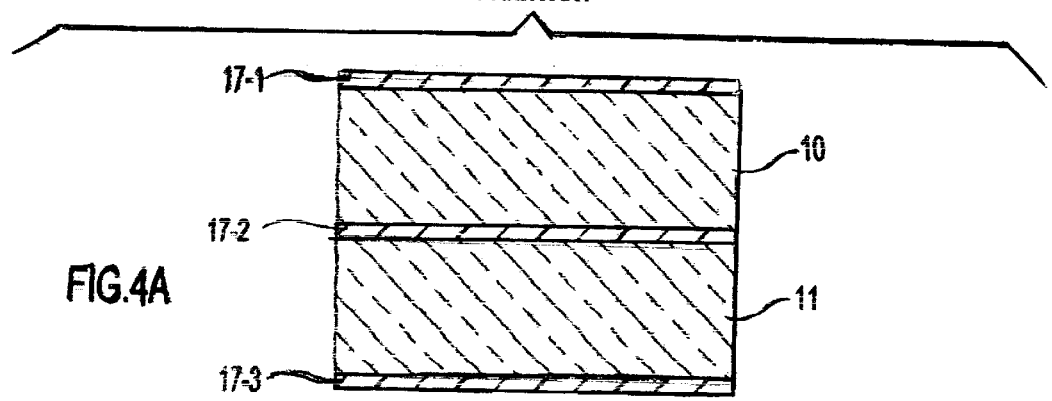
FIG. 4A
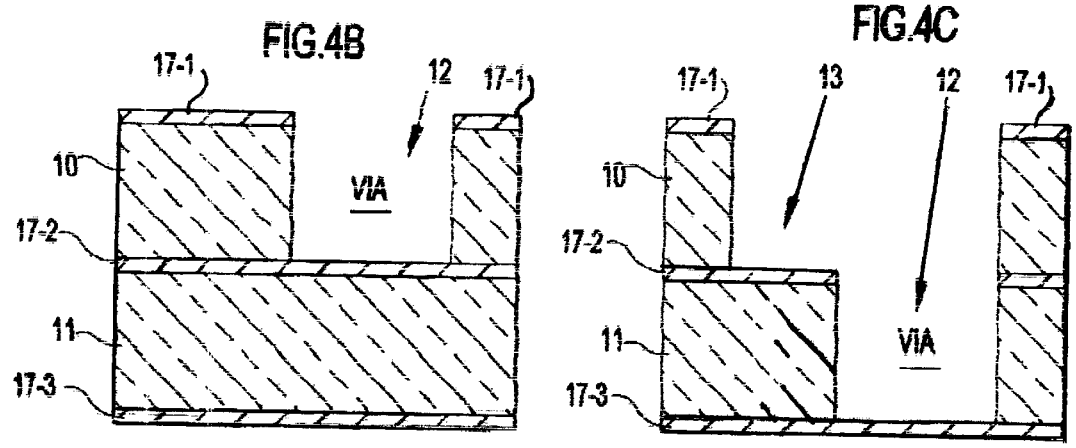
FIG. 4B  FIG. 4C
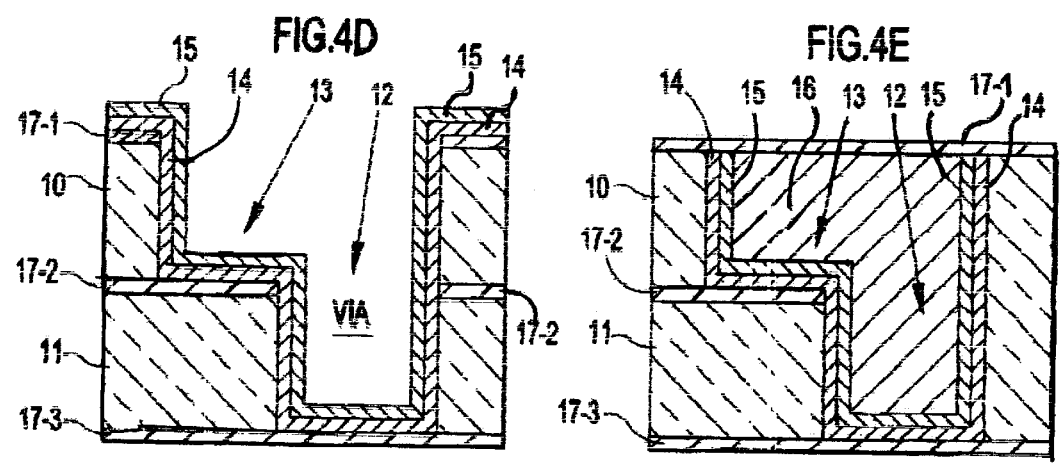
FIG. 4D  FIG. 4E

US 6,596,624 B1

PROCESS FOR MAKING LOW DIELECTRIC CONSTANT HOLLOW CHIP STRUCTURES BY REMOVING SACRIFICIAL DIELECTRIC MATERIAL AFTER THE CHIP IS JOINED TO A CHIP CARRIER

Priority is claimed on Provisional Application Ser. No. 60/146,772, filed in the U.S. Patent Office Jul. 31, 1999.

DESCRIPTION

1. Field of the Invention

This invention relates to high density microminiaturized electronic circuit devices. More particularly, this invention relates to multilevel structures, and the formation of multilevel structures, comprised of alternating via levels and wiring levels embedded in a low dielectric constant medium and mounted on chip carriers.

2. Background of the Invention

Electrically integrated structures having multiple levels of conductive wiring horizontally supported in or on a dielectric material and vertically separated by intermediate levels of dielectric material are well known. Typically, alternating levels of wiring and vias can be quite numerous and complex in layout. The continuing drive toward reduction in dimensions and increase in density of features within these structures is inspired by aggressive requirements of memory, logic and storage density. Smaller device structures result in higher bit density, lower operating voltage, lower energy consumption and faster device speed. Smaller device structures require proportionately narrower and shorter conductor lines, narrower diameter vias and lower dielectric constant materials.

Increased also are the problems associated with such miniaturization and the proximity of the features to one another, including the risks of shorting, crosstalk and capacitive coupling between and especially within wiring levels, additional heat generation due to IR drop and the risk of failure due to electromigration and impeded signal speed.

As the design of the multilevel circuit structures becomes more aggressive, the need to reduce the dielectric constant (Er) of the dielectric insulating material to a value closer to the ideal value of value 1.0 in air or vacuum becomes a necessity. The lower the Er, the faster the signal speed and the rise time and the less the capacitive interaction. Lower Er permits operation of the device at a lower voltage which will result in lower thermal heating due to IR drop. In highly compact IC structures, the Er must be lowered not only in the via interlevels between wiring levels, but more importantly intralevel—within each wiring level. It is more critical to obtain extremely densely patterned circuitry levels separated by extremely low Er dielectric material between adjacent conductor lines within each wiring level to avoid capacitative interaction within the dense wiring levels. The lower the Er, the closer to each other can the lines in a wiring level be placed. It is therefore in the wiring level that the dielectric medium is more beneficially air, another suitable gas, or vacuum, i.e. a hollow structure.

Heat conductors in via levels and horizontal air movement through a hollow structure assure the elimination of any "hot spots". Hot spots would contribute greatly to stress induced electromigration. Likewise, removing the additional heat generated by the densely configured operating structure and maintaining a low weight contribution to the ultimate device, for example such as laptop and hand-held devices, are important problems to solve in building high performance structures of the future.

Various materials, such as polyimide, epoxies, FR4-type resins, cyclotene, polymethyl methacrylate (PMMA) and Novolac-type resins, as well as fluorocarbons and others have been used as dielectric material in multilevel packaging structures, often with additives and fillers to affect properties such as thermal expansion (to reduce cracking and dislocation resulting from differing coefficients of thermal expansion among materials used in the structure), flame retardance, and Er. A high performance dielectric material might have an Er of about 3.2 to about 5.0; a pure fluoropolymer might have an Er as low as 2.1, a polyimide about 3.1 to about 3.5. In order to reduce further the Er to a number more nearly approaching the ideal value of pure air, various materials such as foam or hollow microspheres have been added to the resinous dielectric, the latter as described in U.S. Pat. No. 5,126,192 issued Jun. 30, 1992 to Chellis et al. and assigned to the assignee of the present invention. As the dimensions of the circuitry and particularly the spaces between the individual conductor lines on any one level continue to decrease it is becoming more and more difficult to introduce hollow microspheres or foam dielectrics because the walls of the microspheres or the walls between air bubbles in the foam approach the dimension of the spaces between the conductor lines which is 1500A, 1000A, and eventually 500A.

Until recently in integrated circuit manufacturing, plated wiring was embedded in a dielectric material such as SiO2, polyimide, a combination of SiO2 and Si3O4, or other. One of the newer dielectric products is SiLK, a trademark product of Dow Chemical Company, which is a partially polymerized oligomeric spin-on material in a high purity NMP carrier solvent. The dielectric material provides electrical separation between and physical support for the individual conductor lines in the wiring levels. Support is particularly important in those structures which are built using a damascene process. Silicon dioxide has an Er of about 3.9 to about 4.5 and polyimide about 3.5, leaving room for improvement in current commercial structures as well as demanding improvement for structures of the future.

An article on pp. 575–585 published in the IBM Journal of Research and Development Volume 42 No. 5, September 1998, "Electrochemical process for advanced package fabrication", coauthored by S. Krongelb, J. A. Tornello and L. T. Romankiw, the latter of whom is the inventor herein, includes a description of a process of making, and certain performance measurements of, a multilevel structure which incorporates polyimide dielectric layers and is on a chip carrier. In preparation for creating the scanning electron micrograph (SEM) images of the structure, seen as FIGS. 3 and 4 on p. 580 and FIG. 5 on p. 581, polyimide was removed from a region of the structure by ashing in an oxygen containing plasma. Electrical measurements were performed in order to ascertain that the metallurgy was sound and that good metal-to-metal contact had been obtained during electroplating. The present invention, in which solid dielectric material is replaced by air or vacuum in order to obtain a mechanically sound, multilevel final structure having minimal Er, was not foretold by the reference. Up to the time of the present invention it was assumed that dielectric such as polyimide would provide an minimum Er which would be adequate for the thin film package (chip carrier).

An article on pp. 49–51 published in the journal Electrochemical and Solid State Letters published by the Electrochemical Society, Inc., 1(1), 1998, "Air-Gaps for electrical Interconnections" is coauthored by Paul L. Kohl, Qiang Zhao, Kaushal Patel, Douglas Schmidt, Sue Ann Bidstrup- Allen, Robert Shick and S. Jayaraman. The reference describes the thermal decomposition of a sacrificial polymer at a temperature ramped up to 425 then to 450 degrees C. The sacrificial polymer is removed from between two metal line levels which are fully encapsulated within a permanent dielectric overcoat, and the products of the heat decomposition of the sacrificial polymer, less a thin residue, are forced out by diffusing through the overcoat, leaving a gap remaining in the region occupied by the polymer prior to its decomposition. It is stated in the reference that the effective dielectric constant between the two levels can be lowered to 2.3–2.7 for structures with a 1:1 aspect ratio (h:w), or perhaps lower, depending on the thickness and dielectric constant of the permanent overcoat. Clearly, the technique of thermal decomposition is quite different from that of the present invention. The feasibility of adapting and implementing a thermal decomposition technique in a manufacturing environment would be highly problematic. In order to manufacture a workable device it would be necessary to be able to fabricate more than two conductor line levels. That is would be possible to do so and to have the products of the heat decomposition of numerous levels of sacrificial polymer cleanly diffuse through multiple layers of permanent dielectric has not been described in the article.

A similar approach to the removal of sacrificial carbon or photoresist by heating in oxygen at about 400 to 450 degrees C. for 2 hours, during which $CO_2$ diffuses out through silicon oxide is described in GB2,330,001A, which was published Apr. 7, 1999 by Shih-Wei Sun. In the GB patent the term "ashing" is used for the removal process; in the electronics industry and in Applicant's invention ashing means exposing a substance to be removed to an oxygen containing plasma.

In the Technology News column on page 38 of the March 1999 edition of the journal Semiconductor International, Editor-in-Chief Peter Singer describes Toshiba's use of Carbon dioxide gas dielectric in the wiring level of a multilevel IC. Carbon dioxide is formed when the layer of carbon, which has been sputtered and covered with a thin layer of insulator is heated at 450 degrees C. in an oxygen atmosphere, resulting in the diffusion of oxygen through the thin layer of insulator and its combination with the underlying carbon to form carbon dioxide. Some key questions related to the workability of the resulting structure are identified. It appears from the example given that the process is performed one wiring level at a time, as only one such level is shown or described. It would be more efficient and practical if all levels to be hollowed were hollowed at one time, as in the present invention.

In an article "Future interconnect technologies and copper metallization" pages 63, 64, 68, 72, 74, 76 and 79 of the October, 1998 issue of the journal Solid State Technology, authors X, W. Lin and Dipu Pramanik describe a movement to electroplated copper wiring from aluminum wiring in the ICs of the future as an inevitable necessity. The authors further identify physical vapor deposited (PVD) or chemical vapor deposited (CVD) Ta, TaN, Si3N4 or W as known barriers to copper diffusion into silicon. Plated Cu is used in the present invention, in conjunction with diffusion barriers.

In an article "air gaps lower k of interconnect dielectrics", pages 51, 52, 54, 57 and 58 of the February, 1999 issue of the journal Solid State Technology, authors Ben Shieh, Krishna Saraswat, Mike Deal and Jim McVittio describe results of their modelling of air or vacuum as a dielectric medium in a variety of conductor line dimensions. Their simulation predicts a 40%–50% reduction in capacitance due to air gaps in the aluminum wiring level. The article predicts a possible problem with thermal conductivity in an air dielectric-based structure, which may be ameliorated by having $SiO_2$ or HSQ (hydrogen silesquioxane) in the via levels, and another possible problem of fracture of a multilevel structure during CMP (chemical metal polishing). The cover article "In-line cure of SOD low-k films", pages 29, 32 and 34 of the March, 1999 issue of the journal Solid State Technology, by Tom Batchelder, Wayne Cai, Jeff Bremmer and Doug Gray describes advantages of HSQ as a spin-on dielectric (SOD) due to the method of application being less complex and less expensive than CVD. A spin-on dielectric is a possible alternative permanent dielectric in the via levels of the present invention.

The present invention is unique in providing a functional multilevel chip structure which is mounted on a chip carrier, and a process for making the structure, in which an air, other suitable gas or an at least partial vacuum dielectric contributes to an Er which closely approaches the ideal value. In addition, the present invention provides enhanced cooling of the structure, reduced weight, circumvents thermal expansion mismatch problems, and obviates the need for any process steps related to the inclusion of fillers in dielectric material. In one example, a mechanically and electrically sound structure of up to eleven levels has been built successfully using air dielectric in both the wiring levels and the via levels. The resulting structure is not readily damaged or collapsed by application of reasonable pressure. In another structure of the present invention, in which diamond-like carbon (DLC) provides support in via levels, conductive lines in wiring levels having an air dielectric medium can be as close as 500 Angstroms apart.

In addition to lowering the Er, incorporating gas, such as air, inert gas, $CO_2$, $N_2$ or an at-least-partial vacuum dielectric medium into the structure of the present invention has the advantage of providing Er symmetry from level to level and across a level. In contrast to solid dielectric material, there is less likelihood of obtaining electrical anomalies due to the incorporation of conductive impurities or charged species. There is also less likelihood of XYZ dimensional distortion. Such dimensional instability can occur, for example, if a solid resinous dielectric material is exposed to temperatures at or above its glass transition temperature (Tg). Since areas of high mechanical stress are often sites at which electromigration is initiated, the fact that the conductive wiring is not confined within a solid dielectric can eliminate or reduce local stresses at corners and via/wiring intersections, hence reduce electromigration and electrical failure at the sites. The fact that joining of the chip to the carrier, such as by C4 or wire bonding, occurs before the removal of the temporary dielectric in Applicant's invention enables a strong solder bond to be created while preventing the solder from leaking into the chip structure. The subsequent removal of the temporary dielectric occurs through the open sides of the chip structure.

The present invention is applicable to high performance chips, radio frequency (rf) chips, analog chips, high performance SRAM and DRAM, MEMS and especially to fabrication of metallurgical interconnects referred to as back-of-the-line (BEOL) for mounting on packaging substrates such as ceramic or FR4, for use in memory, logic devices, displays, computers other applications, present and future, that will be apparent to one skilled in the art. The principles of the present invention are suitable for use in a chip structure having any conductor metallurgy, including Cu, Al, Au, Ag or alloys thereof.

SUMMARY OF THE INVENTION

The present invention includes structures and processes useful for both thin film packages and multi-chip modules (MCM). The present invention provides a multilevel integrated wiring structure, and process of making the structure, which involves including a temporary dielectric material which, subsequent to dicing into chips and joining to a chip carrier, is readily and selectively removed, such as by dissolution or by ashing in an oxygen-containing or fluoride-containing atmosphere or plasma, depending on the composition of the sacrificial layers. Without compromising the integrity of the remaining structure, preselected levels are left having hollow areas to be filled with air or other suitable gas, or to be placed under at-least-partial vacuum, the gas or vacuum functioning as a permanent dielectric medium. Under the present invention, the electrically conducting columns, and "dummy" columns strategically placed uniformly throughout the chip and in the chip periphery also render strong mechanical support between wiring levels during the chemical mechanical polishing process (CMP) and subsequently in the completed chip and chip/carrier structure.

A structure has been fabricated having as many has 11 levels and an air dielectric medium in both the via and the wiring levels. Alternate structures under the present invention include solid permanent dielectric material in preselected via levels for additional support and the use of a silicon-containing dielectric material as a temporary dielectric in the place of a temporary resin resist dielectric.

BRIEF DESCRIPTION OF THE DRAWINGS

FIGS. 2A and 2B show in cross section a prior art approach in which a permanent solid dielectric material is disposed within the conductor levels and via levels of the chip structure. FIGS. 2C and 2D show in cross section the approach of the present invention in which, after completion of the package, a gas or vacuum dielectric is disposed within the chip structure.

FIGS. 4A–4E show steps in a typical dual damascene process. From pages 567–574 of IBM Journal of Research and Development, Vol. 42, No. 5, September, 1998.

BEST AND VARIOUS MODES FOR CARRYING OUT THE INVENTION

In order to facilitate understanding of the present invention, reference is made to the following detailed description taken in conjunction with the drawings.

In an embodiment of the present invention, support which is normally provided to a multilevel IC structure by a solid dielectric is provided instead by the conductive vias and by additional support columns located strategically among the devices and vias, at the chip periphery, or both. The supports are preferably made of the same material as the conductors, preferably copper or a copper-containing alloy. DLC and SiO2 can alternatively function as supports in places where it is required that the supports not be electrically conductive. In another embodiment of the present invention, a temporary dielectric material is removed, by means such as dissolution in a suitable solvent, sputter etching or plasma ashing, from wiring levels and from only selected via levels.

Aside from the presence of wiring, vias, and any supports and any other electronic device features, removal of temporary dielectric material in all via and wiring levels, or in selected levels of the structure, leaves those levels hollow, to be filled with air or another gas or an at-least-partial vacuum as the dielectric medium. It is particularly important to provide this minimum value dielectric medium in wiring levels.

Especially if vacuum is to be used as the dielectric material, means for providing heat dissipation is called for, DLC, with an Er contribution of about 3.5, SiO2, silicon nitride, aluminum nitride or any other compatible material having good dielectric and thermal properties can be present about every two, every four or every six via levels to function as thermal conductors. One suggested structure would include DLC in every via level and air or vacuum in the conductor, i.e. wiring, levels, except for the first and last via level. These thermally conductive permanent dielectrics also provide additional mechanical support to the structure.

It is recommended that at the completion of the fabrication of the structure on the substrate wafer but prior to dicing the substrate into chips, attaching the chips to a carrier, and removing the temporary dielectric layers, a brief anneal be performed to reduce any mechanical stresses and stabilize the structure.

Figure 1A:
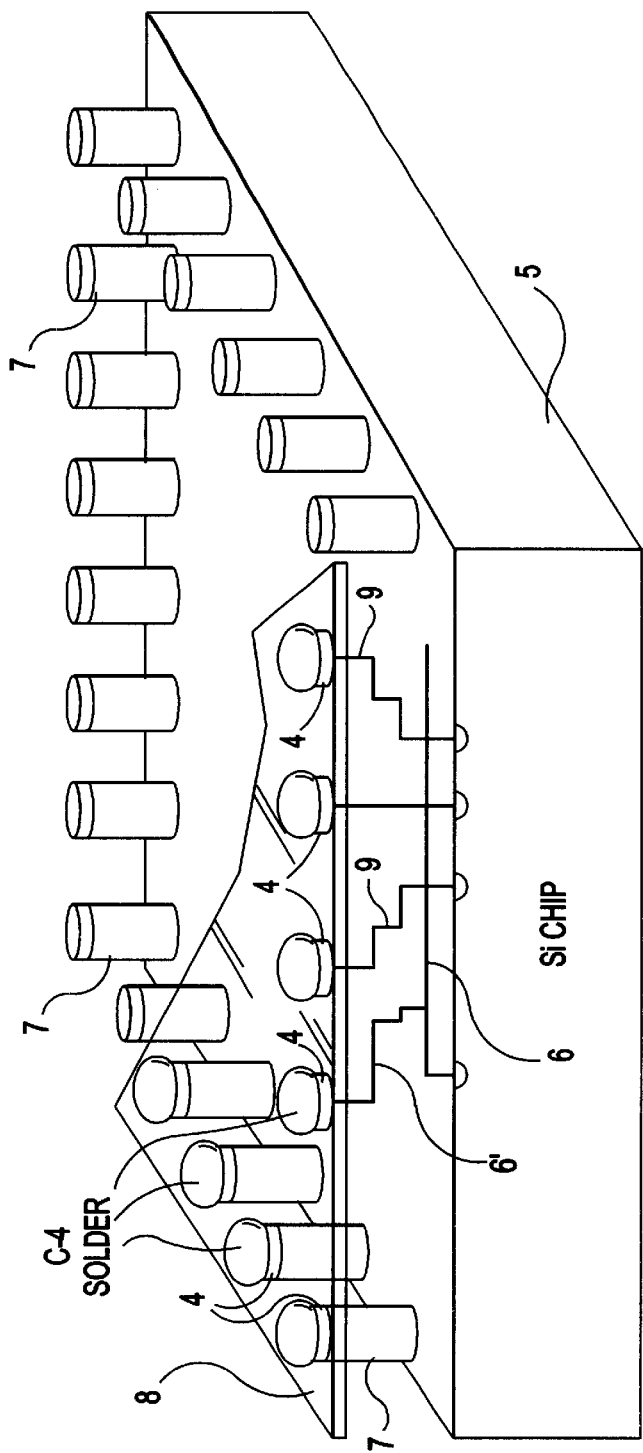
FIG. 1A is an isometric view of a chip showing a structure of the present invention. Both vias and peripheral support studs (columns) are shown to support the wiring levels, which are otherwise separated by and are filled with the gas of choice or vacuum. A final cover layer of SiO2 or of DLC with imbedded top surface metallurgy and solder pads is indicated but not fully shown.

The silicon substrate (5) of a structure of the present invention for BEOL application is shown in FIG. 1A. An interdiffusion barrier followed by seed (neither shown) have been deposited and conductive copper wiring patterned onto the substrate (5). Support studs (7) around the periphery of the chip provide additional support as well as heat dissipation. The additional supports are preferably made of the same material as the wiring (6) and the conductive vias (9), preferably copper, and deposited by plating. Vias (9) are used as conductors between wiring levels and as support studs. Conductive vias join a number of wiring levels and ultimately terminate at contact pads (4).

The space in the wiring levels (6 and 6') which had been occupied earlier in the manufacture of the structure by a temporary dielectric material such as Novolac resin, polyimide, PMMA, SiLK or other has been removed, leaving vias and wiring in an otherwise hollow, air-filled dielectric environment and coated with an anticorrosion overcoat (not shown). Since the chip must be joined to a carrier prior to removal of the temporary dielectric material, the joining must be performed at sufficiently low temperature so that a resinous temporary dielectric material, such as AZ resist, would not totally polymerize or char. If material such as SiO2, polyimide or SiLK is used as the temporary dielectric, however, a higher joining temperature could be tolerated. The joining temperature required determines the choice of solder in C4 joining, for example, among Snbi, SnGa, or SnAu.

For clarity of illustration, the top layer (8) is only indicated along the near edge of the periphery.

Figure 1B:
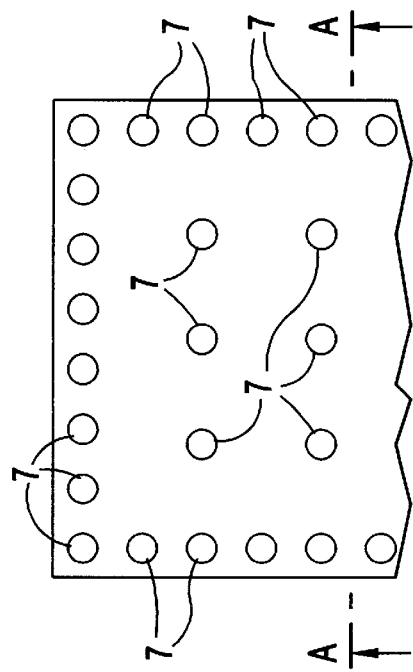
FIG. 1B illustrates from a top view a via level having metallic columns, with the via metallic columns shown disposed in the center area of a chip. Additional supports are shown disposed around the periphery. Circuitry is not shown, as the view is of the via/support level.

FIG. 1B shows from the top support studs (7) at the periphery of the chip and at several locations within the chip which extend vertically through the thickness of the chip. These support studs (7) provide additional support to a hollow structure and conduct heat away in the completed working device. They also play an important role during CMP. If the temporary dielectric is softer than the metal conductor, the presence of strategically placed support studs in addition to vias will assure uniform chemical metal polishing.

Figure 2D:
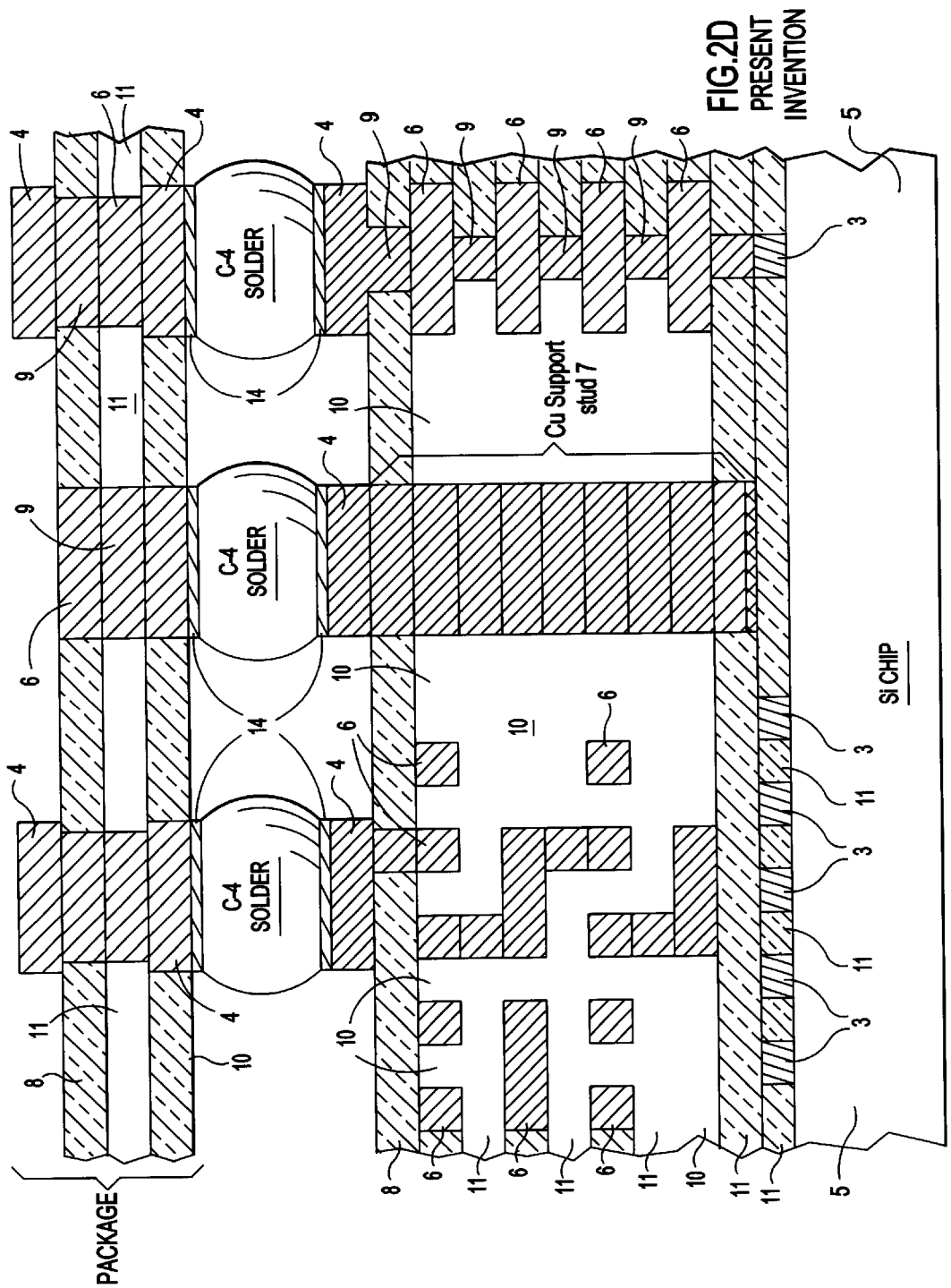

FIGS. 2A and 2B show in cross section a prior art BEOL structure. The figures indicate stacked vias (9) vertically connected to wiring through contact pads (4) in the wiring levels. In the figures, a permanent solid dielectric materials is shown throughout, as is conventional in the prior art. In the present invention, all or most solid dielectric material is temporary. FIG. 2C shows how a prior art structure such as shown in FIGS. 2A and 2B would appear with the temporary solid dielectric removed from conductive wiring levels after attachment to a package, as in an aspect of the present invention. Support stud (7) is included in FIG. 2C. FIG. 2D shows how the FIG. 2C structure would appear if the temporary solid dielectric were removed from the via levels as well as the conductive wiring levels after attachment to a package, as in another aspect of the present invention.

Figure 3:
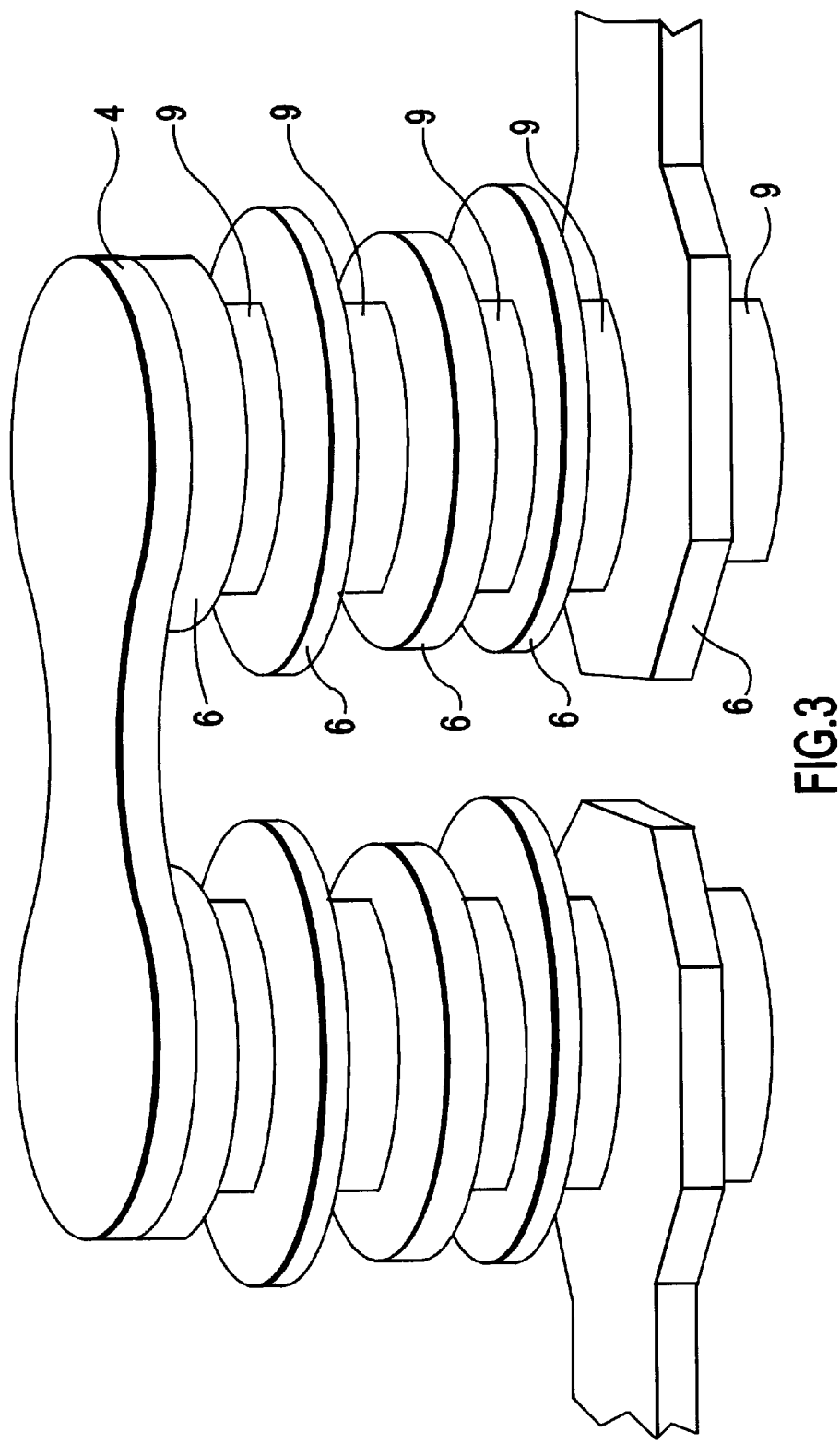
FIG. 3 shows a self-supporting hollow structure of the present invention having eleven layers. The top level of semiconductor is not shown.

In the 11-layer structure shown in FIG. 3, the temporary dielectric material was a polyimide, which has been removed by ashing in an oxygen-containing plasma. A contact pad (4) is shown at the top of alternating wiring levels (6) and conductive vias (9). FIG. 3 is drawn from a structure that was built by the plate and fill approach, which produces two levels at a time with one seed layer.

FIGS. 4A–4E represents a typical damascene process in which the via level dielectric (11) and conductor level dielectric (10) have been coated with layers of silicon nitride (17-1), (17-2) and (17-3) as shown in FIG. 4A. In FIG. 4B the top layer of silicon nitride (17-1) has been opened and the beginning of a via (12) has been etched through conductor level dielectric (10). In FIG. 4C silicon nitride (17-2) separating via level dielectric (11) and conductor level dielectric (10) has been opened, the etching for via (12 has been completed through via level dielectric (11) and etching for conductor line (13) has been completed through conductor level dielectric (10). In FIG. 4D barrier layer (14) has been deposited onto the interior surface of via (12) and conductor line (13), and plating seed layer (15) has been deposited over barrier layer (14). In FIG. 4E metal (16) has been plated over seed layer (15) to fill via (12) and conductor line (13), and silicon nitride (17-1) has been redeposited in preparation for further processing.

In the examples which follow:

The term seed layer refers to a layer of conductive material deposited in order to form a conductive base for the plating of metal. A sputtered seed layer comprised of Ta or TaN (the diffusion barrier component)/Cu (the adhesive component for plated conductor) has been found satisfactory, as has Ti/Cu or TiTa/Cu. The diffusion barrier component of the seed inhibits interdiffusion of copper and SiO2 dielectric; the adhesion component assures initiation of plating and adhesion of the plated metal to the substrate. Alternatively, the adhesion/diffusion barrier can be electroless CoP, CoSnP, CoWP or others known in the art.

Photoresist refers to a light sensitive working resist the use of which is compatible with the processing steps of the invention. Novolac, an azide resist which cures at about 110 to about 140 degrees C., has been found satisfactory. Other resists, such as polymethyl methacrylate (PMMA) or cyclotene can also be used effectively. Removal of Novolac resist is satisfactorily accomplished in acetone, by ashing in an oxygen-containing plasma or, if blanket exposed, by a KOH developer or by a suitable organic solvent.

Temporary (aka sacrificial) dielectric refers to those layers of material designated to be removed and replaced by air, other suitable gas or at-least-partial vacuum. Cured resist is preferred; certain other material such as SiO2 are alternate choices.

The step to mount the chip to a carrier is referred to as soldering or as joining. C4 soldering has been found satisfactory, even for low-temperature joining. Soldering must be completed before the removal of the temporary dielectric material.

Above the substrate level, any SiO2 and DLC levels have been deposited by sputtering or CVD. Alternatively, an organosilicate material may be spun on in a liquid form and cured.

Chemical Metal Planarization: (CMP) has been performed after the plating of the via/studs to assure that the studs are of even height with the dielectric material in that stud level and to assure electrical contact with the wiring level immediately following. Planarization using a combination of alumina particles and ferric chloride has been found satisfactory, and KOH solution at a pH of about 9 has been found satisfactory as well, for some applications.

It is advisable that any copper to be in contact with air dielectric or other chemically active gas be coated with an anti-corrosion overcoat. Co/CoO3, electroless CoP, Ta or benzotriazole (BZT) have each been found satisfactory.

EXAMPLE 1

A hollow multilevel structure wherein the substrate is Si and the temporary dielectric material is a resist. In this example, DLC can be used as a dielectric in the via levels.

1. A Si wafer substrate with the semiconductor devices is metal film seeded with an adhesive and conductive metallic material and a positive photoresist is applied over the seed layer and cured. A mask pattern for a first wiring level, including any support studs, is exposed and developed, and copper wiring is plated into the openings developed in the resulting photoresist mask. This conductor level is aligned with tungsten vias which provides connection through the bottom SiO2 to the substrate and to active devices.

2. A fresh layer of photoresist is applied, cured, and exposed and developed is a first via level pattern. Vias and any studs and peripheral supports are plated and vias are planarized before removal of resist.

3. The remaining resist and the seed layer underlying it are removed and a fresh layer of resist is backfilled, cured, and CMP planarized to expose the top surface of the vias. A new adhesive/conductive seed layer is applied. A fresh layer of resist is spun on over the seed and cured, and a pattern for a second level of wiring is exposed, developed and wiring is plated through the photoresist mask.

4. Steps 2 and 3 are repeated until the number of levels desired have been fabricated.

5. A cover layer of SiO2 is sputtered or spun on and planarized before removal of resist.

6. Resist is applied, exposed and developed, vias are opened in SiO2 and remaining resist is removed.

7. A seed layer is sputtered, resist is applied, exposed and developed and copper pads are electroplated. The copper pads are plated with a Ni barrier followed by electroplating of SnPb solder.

8. Resist is removed, seed layer is etched away and plated solder is reflowed.

9. The wafer is diced into individual chips and at least one chip is joined to a package or to a chip carrier using a soldering process.

10. The remaining, temporary, dielectric is removed by chemical etching or plasma, leaving a hollow joined chip structure comprising alternating wiring and via levels in which the temporary resist dielectric has been removed and replaced by air, some other suitable gas or at least a partial vacuum.

Example 2

A variation in which additional stability is obtained for the hollow multilevel structure by applying DLC, SiO2, silicon nitride or the like in one or more via levels.

1. A Si wafer substrate is seeded with an adhesive and conductive metallic material and a positive photoresist is applied over the seed layer and cured. A mask pattern for a first via level is exposed in the photoresist and developed, and copper is plated into the via openings developed in the photoresist mask.

2. The remaining resist and the seed underlying it are removed. SiO2 is applied onto the via level and planarized to reveal the top surfaces of the vias.

3. The applied SiO2 is seeded with an adhesive and conducive metallic material and a positive photoresist is applied over the seed and cured. A mask pattern for a first wiring level, including any support studs, is exposed and developed. Copper is plated into the openings developed in the resist mask.

4. The undeveloped resist is removed. Fresh resist is applied and planarized to expose the top surfaces of the wiring.

5. A fresh seed layer is applied to the planarized wiring level, and photoresist is applied over the seed layer and cured. A mask pattern for a second via level, including any support studs, is exposed and developed in the photoresist. Copper is plated into the developed via level openings and is planarized.

6. The remaining photoresist and seed layer thereunder are removed, and SiO2 is applied onto the second via level and planarized to reveal the top surfaces of the vias.

7. Steps 3–6 are repeated until the number of levels desired have been fabricated.

8. A cover layer of SiO2 is applied and planarized.

9. Resist is applied, cured, exposed and developed, vias are etched in the SiO2 to provide connection to the vias and dummy studs are fabricated, including those studs around the periphery of the chip.

10. Resist used in step 9 is removed and a seed layer is applied.

11. A fresh thick resist is applied, cured, exposed and developed to define the solder pads and form the C4 bumps.

12. Copper is plated on the pads followed by a Ni barrier layer and very thin gold is plated, followed by thick SnPb.

13. Resist and seed layer are removed by electrochemical and/or chemical etching, SnPb oxide is cleaned off and the C4 SnPb is reflowed.

14. The wafer is diced into individual chips, and at least one chip is joined to a package or a BEOL carrier using a low temperature joining process such as wire bonding or C4 bonding.

10. Step #10 from example 1 above is performed.

EXAMPLE 3

A hollow multilevel structure wherein the first dielectric layer is DLC and the temporary dielectric is SiO2.

In Example 3 described below, DLC comprises the first and the final dielectric layers of the structure, and a silicon-containing material such as SiO2 is used instead of resist as the temporary dielectric material. When the desired number of levels has been fabricated, the structure is soldered to a carrier and the SiO2 is removed in a fluoride-containing solvent which does not attack the metal or the DLC, such as a nonaqueous solution which includes about 0.5M to about 15M of fluoride in at least one organic solvent described in US6033996 to Jagannathan et al. What is left is a self supporting hollow chip structure which is filled with air dielectric, other gas, or an at-least-partial vacuum. If the structure requires additional stability, DLC can be sputtered during fabrication no more frequently than in alternate via levels.

1. A Si device substrate is seed with an adhesive and conductive metallic material and a positive photoresist is applied over the seed layer and cured. A mask pattern for a first via level is exposed and developed, and vias and any additional support studs are plated through openings in the resulting photoresist mask.

2. The undeveloped resist and the seed underlying it are removed and SiO2, silicon nitride or another Si-containing material is backfilled into the first via level. The backfilled SiO2 is planarized to open up the conductive vias, then seeded with an adhesive and conductive metallic material, and photoresist is applied over the seed layer and cured.

3. A mask pattern for a first wiring level is exposed and developed, and conductive copper wiring is plated through the openings in the resulting photoresist mask.

4. The resist remaining and the seed underlying it are removed. A fresh layer of SiO2 is applied to the plated first wiring level and planarized to expose the wiring. Photoresist is cured, exposed and developed, and a second via level is plated through openings in the resulting photoresist mask.

5. The fabrication steps for the second via level are the same as for the first via level except for being on SiO2 rather than DLC. Subsequent alternating layers or wiring and via levels are fabricated until the total number desired has been fabricated.

6. The final layer, DLC, is sputtered and the top surface metallurgy is fabricated as described in steps 9 through 13 of Example 2 above.

7. The wafer is diced into chips, and at least one chip is low-temperature joined to a carrier. The Si-containing material is etched away preferentially in a substantially nonaqueous organic fluoride-containing solution.

Example 4

In another alternative a conventional dual damascene process is used. Adapting the conventional damascene approach, which is illustrated in FIG. 4, conductor and via patterns are opened in SiO2 inorganic dielectric or in SILK or other organic dielectric.

1. The Si substrate, including patterned lines and vias, is seeded.

2. Copper is electroplated, followed by CMP planarization, which results in a structure like the one illustrated in FIG. 4(e).

3. Another two layers of inorganic or of organic dielectric described above, SiO2 in the present example, are applied and the opening and seeding processes described above are repeated. The process is repeated as many times as necessary to produce a structure such as the one illustrated in FIG. 2(a) or 2(b).

4. Top surface metallurgy is fabricated as described in steps 9 through 13 of Example 2 above.

5. The structure is diced into chips and the chips are attached to a carrier using C4.

6. The SiO2 is then selectively chemically etched away, or if organic dielectric or other dielectric removable by O2, etched away in an oxygen-containing plasma, resulting in a hollow structure having an overall dielectric constant about equal to 1.

7. After removal of the dielectric the exposed copper conductors can be protected by electroless plating of CoP or by overcoating with BZT.

Example 5

In this example the dielectric layers are alternated between SiO2 and DLC or between SiO2 and SiLK or other organic dielectric. The more rigid dielectric is preferably used in the via levels and the less rigid dielectric in the conductor levels. The process followed is like the one described in Example 2. When sufficient layers are completed to produce a structure such as is shown in FIGS. 2A and 2B the wafer is diced into individual chips which are C4 bonded to a carrier.

Assuming the metal in the structure is protected from attack by the plasma, if a temporary dielectric selected for the conductor levels is removable in O2 plasma and a permanent dielectric selected for the via levels is not, treatment with O2 plasma will leave the permanent dielectric in place in the via levels while selectively removing the temporary dielectric from the conductor levels leaving the conductor levels to be filled with air, other suitable gas or partial vacuum. The result will be a dielectric constant of 1 in the conductor levels, where low dielectric constant matters most, highly supported by the via levels. Assuming the solvent selected will not attack the metal in the structure, the same strong structure having very low dielectric constant will result if a temporary dielectric selected for the conductor levels is removable in an organic solvent and a permanent dielectric selected for the via levels is not. If the via level dielectric is DLC, thermal conductivity will be enhanced.

It will be obvious to one skilled in the art that other combinations of specific materials and other processes can be used as long as the following key requirements described in Examples 1–5 are maintained:

1. The mask design for the initial chip layout should incorporate strategically placed vias to be plated with support studs throughout the chip and around the periphery of the chip as shown in FIGS. 1A and 1B.

2. The support studs must be plated each time another level of vias and another level of conductors is plated. The support studs also undergo every CMP processing step.

3. The means for removal of the temporary dielectric should be selective and should not damage the metal or permanent dielectric material 4. The top surface metallurgy, including SnPb bumps or gold bumps, are formed.

5. Prior to removal of the temporary dielectric material, the chips must be diced and attached to the chip carrier (aka package) using such conventional means as C4, thermal compression, wire bonding and the like.

The above examples are intended to be illustrative rather than exhaustive, and while the invention has been described in conjunction with specific embodiments, many additional embodiments, modifications and applications will be apparent now and in the future to those skilled in the art.

What is claimed is:

1. A process for making a multilevel integrated circuit chip structure, comprising:
   a. depositing atop a semiconductor substrate a minimum total of between about 5 and about 11 layers, comprising support studs provided at preselected sites within the chip and through all levels in the chip periphery, and via levels alternating with copper wiring levels which are protected with an anticorrosion overcoat;
   b. providing a temporary dielectric material in more than two of the copper wiring levels, and providing a permanent solid dielectric material in any levels in which temporary dielectric material is not provided;
   c. dicing the resulting chip structure into individual chips and joining at least one diced chip to a chip carrier;
   d. after joining, selectively removing the temporary dielectric material by means selected to be nondestructive to the permanent solid dielectric material and to the structure as a whole; and
   e. replacing the temporary dielectric material with a permanent gas dielectric material selected from the group consisting of air, nitrogen, carbon dioxide, mixtures thereof and partial vacuum.

2. The process recited in claim 1, wherein the temporary dielectric material is selected from the group consisting of an azide resist, SiO2, SiLK, an organosilicate, PMMA, cyclotene and polyimide.

3. The process recited in claim 1, wherein the permanent solid dielectric material is selected from the group consisting of DLC, Si3N4, SiO2, and AlN.

4. The process recited in claim 1, wherein the temporary dielectric material is SiO2 and the permanent solid dielectric material is DLC.

5. The process recited in claim 1, wherein the temporary dielectric is a polyimide and the permanent solid dielectric is selected from the group consisting of DCL, SiO2 and Si3N4.

6. The process recited in claim 1, including also a CMP planarization step between levels.

7. A process for making a multilevel IC chip structure, comprising:
   a. providing a semiconductor device level substrate;
   b. applying a first diffusion barrier/adhesive plating seed layer onto the semiconductor device level substrate;
   c. applying and curing a first layer of photoresist over the first seed layer;
   d. exposing and developing in the first layer of photoresist a mask for a first wiring level pattern;
   e. plating a conductor into the developed first wiring level pattern to form a first wiring level;
   f. applying and curing a second layer of photoresist onto the first wiring level;
   g. exposing and developing in the second layer of photoresist a mask for a first via pattern;
   h. plating a conductor into the developed first via level pattern to form a first via level;
   i. removing the undeveloped photoresist on the first wiring level and first via level and the seed under the undeveloped photoresist;
   j. backfilling the first via level with sacrificial dielectric material, curing and planarizing the sacrificial dielectric material to expose vias, and applying a second seed layer;

k. applying and curing a second layer of photoresist over the second seed layer;
l. exposing and developing in the second layer of photoresist and mask for a second wiring level pattern including any dummy support studs;
m. plating a conductor into the developed second wiring level pattern and the any dummy support studs to form a second wiring level;
n. repeating steps f through m for any third and subsequent wiring levels until the total number of wiring levels desired has been fabricated;
o. applying a layer of permanent dielectric material over a final level, applying and curing photoresist on the permanent dielectric material, exposing and developing a pad pattern and etching through the permanent dielectric to open an electrical connection between vias and pads;
p. dicing the multilevel structure into individual chips;
q. joining at least one chip to a carrier; and
r. removing all selected layers of sacrificial dielectric material from the at least one chip.

8. The process recited in claim 7, wherein the steps of applying a first and a second plating seed layer comprise sputtering a plating seed layer selected from the group of plating seed layers consisting of TiTa/Cu, Ti/Cu, Ta/Cu, CoP/Cu, CoSnP/Cu, CoWP/Cu, W/Cu and TaN/Cu.

9. The process recited in claim 7, wherein the step of applying and curing a layer of photoresist comprises applying and curing a photoresist selected from the group consisting of methacrylate, polyimide, azide resist and cyclotene-based resins.

10. The process recited in claim 7, wherein the steps of plating a conductor comprises electroplating a conductor selected from the group consisting of copper and alloys thereof.

11. The process recited in claim 10, including the additional step of applying a corrosion-inhibiting coating on the conductor.

12. The process recited in claim 11, wherein the step of applying a corrosion-inhibiting coating on the conductor comprises applying a coating selected from the group consisting of Co/CoO3, CoP, Ta and BZT.

13. The process recited in claim 7, comprising, between the step of fabrication of the total number of levels desired and the step of joining, the additional step of applying a dielectric material selected from the group consisting of SiO2, DLC, Si3N4, Al nitride and organic dielectric and exposing openings for connecting preselected vias and joining pads.

14. The process recited in claim 7, wherein the step of removing undeveloped photoresist comprises removing undeveloped photoresist with a solvent comprising acetone or KOH, or ashing in an oxygen-containing plasma.

15. The process recited in claim 7, including the additional step, prior to dicing the multilevel structure into individual chips, of annealing the multilevel structure to stabilize it.

16. The process recited in claim 7, wherein the step of planarizing comprises chemical mechanical planarizing using alumina particles with ferric chloride, or KOH having a pH of about 9.

17. The process recited in claim 7, wherein the step of joining comprises C4 soldering using SnPb, SnBi, SnGa or SnAu.

18. The process recited in claim 7, wherein the step of removing the undeveloped photoresist comprises blanket exposing the undeveloped photoresist and dissolving it in a photoresist developer.

19. The process recited in claim 7, wherein the steps of plating a conductor into via level patterns and plating a conductor into wiring level patterns include the additional steps of planarizing the plated via level and the plated wiring level.

20. A process for making a multilevel IC chip structure, comprising:
a. providing a semiconductor substrate having a device level which includes planarized vias and imbedded devices;
b. applying a first diffusion barrier/adhesive plating seed layer onto the device level substrate;
c. applying and curing a first layer of photoresist onto the first plating seed layer;
d. exposing and developing in the first layer of photoresist a mask for a first via level pattern;
e. plating a conductor into the developed first via level pattern to form a first via level;
f. removing the remaining first layer of photoresist and the first layer of seed under the remaining first layer of photoresist;
g. depositing a first layer of dielectric material onto the first via level and planarizing;
h. applying a second plating seed layer onto the planarized first via level;
i. applying and curing a second layer of photoresist over the second plating seed layer;
j. exposing and developing in the second layer of photoresist a mask for a first wiring level pattern;
k. plating a conductor into the developed first wiring level pattern;
l. removing the remaining second layer of photoresist and the second plating seed layer under the remaining second layer of photoresist;
m. depositing a second layer of dielectric material onto the first wiring level and planarizing;
n. repeating steps b through m until the desired number of levels has been fabricated;
o. applying a layer of permanent dielectric material onto the final one of the desired number of levels, preparing openings in the permanent dielectric material for plating and joining, plating conductor into the prepared openings and plating solder onto the plated conductor;
p. dicing the multilevel structure into chips;
q. joining at least one chip to a chip carrier; and
r. removing the dielectric material from at least one wiring level of the at least one chip.

21. The process recited in claim 20, wherein the step of applying a first layer of dielectric material comprises applying a dielectric selected from the group consisting of a silicon dioxide, a silicon nitride, and an aluminum nitride.

22. The process recited in claim 20, wherein the step of removing the dielectric material comprises preferentially dissolving SiO2 dielectric material in a substantially non-aqueous composition which includes about 0.5M to about 15M of a fluoride in at least one organic solvent.

23. The process recited in claim 20, wherein the permanent dielectric material and the dielectric material in at least one via level comprises DLC and the dielectric material in at least one wiring level comprises SiO2.

24. The process recited in claim 20, wherein the step of removing dielectric material comprises removing dielectric material by sputter etching or plasma etching.

* * * * *